US011837313B2

(12) United States Patent
Raj et al.

(10) Patent No.: US 11,837,313 B2
(45) Date of Patent: Dec. 5, 2023

(54) MEMORY WITH EFFICIENT DVS CONTROLLED BY ASYNCHRONOUS INPUTS

(71) Applicant: QUALCOMM Incorporated, San Diego, CA (US)

(72) Inventors: Pradeep Raj, Uttar Pradesh (IN); Rahul Sahu, Bangalore (IN); Sharad Kumar Gupta, Bangalore (IN); Chulmin Jung, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 212 days.

(21) Appl. No.: 17/517,386

(22) Filed: Nov. 2, 2021

(65) Prior Publication Data
US 2023/0139283 A1 May 4, 2023

(51) Int. Cl.
| | |
|---|---|
| *G11C 29/00* | (2006.01) |
| *G11C 29/50* | (2006.01) |
| *G11C 8/08* | (2006.01) |
| *H03K 19/0175* | (2006.01) |
| *H03K 19/20* | (2006.01) |

(52) U.S. Cl.
CPC .......... *G11C 29/50016* (2013.01); *G11C 8/08* (2013.01); *G11C 2029/5004* (2013.01); *H03K 19/017509* (2013.01); *H03K 19/20* (2013.01)

(58) Field of Classification Search
CPC ................ G11C 29/50016; G11C 8/08; G11C 2029/5004; H03K 19/017509; H03K 19/20
See application file for complete search history.

(56) References Cited

U.S. PATENT DOCUMENTS

| | | | |
|---|---|---|---|
| 5,381,373 A | 1/1995 | Ohsawa | |
| 9,001,572 B2* | 4/2015 | Choi | G11C 5/14 365/185.23 |
| 10,446,196 B1 | 10/2019 | Narasimhan et al. | |
| 2004/0181717 A1 | 9/2004 | Madge et al. | |
| 2011/0037494 A1 | 2/2011 | Hung et al. | |
| 2011/0072323 A1 | 3/2011 | Chong et al. | |
| 2015/0089250 A1* | 3/2015 | Hess | G11C 5/148 713/300 |
| 2016/0012867 A1* | 1/2016 | Chhabra | G05F 1/46 327/537 |
| 2019/0051341 A1 | 2/2019 | Li et al. | |
| 2021/0199710 A1 | 7/2021 | He et al. | |

OTHER PUBLICATIONS

International Search Report and Written Opinion—PCT/US2022/046341—ISA/EPO—dated Jan. 26, 2023.

* cited by examiner

*Primary Examiner* — Christine T. Tu
(74) *Attorney, Agent, or Firm* — Haynes and Boone, LLP (57) ABSTRACT

A memory is provided that is configured to practice a sleep mode without retention in which a both bitcell array and a memory periphery are powered down responsive to an assertion of sleep mode without retention control signal. The sleep mode without retention control signal is also asserted during a DVS scan to power down the bitcell array. The memory includes a power management circuit that responds to an assertion of a DVS scan control signal to prevent the assertion of the sleep mode without retention control signal from causing a power down of the memory periphery during the DVS scan. The memory periphery may thus be thoroughly tested by the DVS scan because leakage current from the bitcell array is prevented by the powering down of the bitcell array.

23 Claims, 6 Drawing Sheets

MEMORY WITH EFFICIENT DVS CONTROLLED BY ASYNCHRONOUS INPUTS

TECHNICAL FIELD

This application relates to memories, and more particularly to a memory with a dynamic voltage stress (DVS) scan controlled by asynchronous inputs.

BACKGROUND

A dynamic voltage stress (DVS) scan is an important tool for an integrated circuit manufacturer to test their embedded memory function. During a DVS scan, the power supply voltage is increased to unmask faults. For example, memory transistors may have a weak dielectric layer that will eventually fail. But despite the weak dielectric layer, the memory is functioning and thus could be sold to a customer, whereupon it will eventually fail and lead to costly returns. A DVS scan exposes such faults so that a high-quality product may be delivered.

Despite the importance of a thorough DVS scan, existing memory designs limited the power supply voltage increase that could be applied. Accordingly, there is a need in the art for memories configured for improved DVS scans.

SUMMARY

In accordance with an aspect of the disclosure, a memory is provided that includes: a bitcell array; a bitcell array head switch coupled between the bitcell array and a node for a memory power supply voltage; a memory periphery including a memory power domain portion; a memory periphery head switch coupled between the memory power domain portion and the node for the memory power supply voltage; and a power management circuit configured to switch off the bitcell array head switch and the memory periphery head switch to power off the bitcell array and the memory power domain portion during a sleep mode without retention for the memory, the power management circuit being further configured to switch off only the bitcell array head switch to power off the bitcell array and to maintain a power on of the memory power domain portion during a scan of the memory.

In accordance with another aspect of the disclosure, a method of operation for a memory is provided that includes: powering down a bitcell array and a memory periphery in the memory responsive to an assertion of a sleep mode without retention control signal while a dynamic voltage stress scan control signal is not asserted; powering down the bitcell array in the memory while powering the memory periphery responsive to an assertion of both the sleep mode without retention control signal and the dynamic voltage stress scan control signal; and performing a dynamic voltage stress scan of the memory periphery while the memory periphery is powered and the bitcell array is powered off following the assertion of both the sleep mode without retention control signal and the dynamic voltage stress scan control signal.

In accordance with yet another aspect of the disclosure, a memory is provided that includes: a memory periphery including a memory power domain portion; a periphery head switch coupled between a node for a memory power supply voltage and the memory power domain portion; and a power management circuit including a first logic gate configured to assert a dynamic voltage stress scan control signal responsive to an assertion of a core power domain control signal, wherein the power management circuit is configured to switch off the periphery head switch responsive to an assertion of a sleep mode without retention control signal while the dynamic voltage stress scan control signal is de-asserted, and wherein the power management circuit is further configured to keep the periphery head switch on responsive to an assertion of both the sleep mode without retention control signal and the dynamic voltage stress scan control signal.

These and additional advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

An integrated circuit memory with an improved DVS scan is provided. To better appreciate the advantageous features of this improved DVS scan, consider the challenges that a successful DVS scan should overcome. For example, an integrated circuit memory is typically segregated into its own power domain denoted herein as an MX power domain whereas a core logic of the integrated circuit is segregated into a core power domain denoted herein as a CX power domain. An MX power supply voltage powers the MX power domain. Similarly, a CX power supply voltage powers the CX power domain. The memory includes a bitcell array that is controlled by a memory periphery (write drivers, address decoders, and so on). A portion of the memory periphery is in the CX power domain whereas a remaining portion is in the MX power domain.

While a memory is tested by a typical DVS scan, both the bitcells and the memory periphery are powered. Due to the elevated MX supply voltage, substantial leakage current typically conducts from the bitcells during the DVS scan. In addition, the memory periphery consumes current from both the MX and CX power domains. The bitcell leakage combined with the current draw by the memory periphery may cause damaging temperature spikes. To prevent a DVS scan from damaging the memory, it is thus conventional to limit the MX power supply voltage increase. Although this limit on the power supply voltage increase keeps the memory temperature in a safe range, the weakened DVS then fails to unmask faults, leading to undesirable failures during customer use and costly returns.

To limit complexity and DVS scan latency, it is advantageous that a DVS scan be compatible with the control signals for memory sleep modes using during normal (non-DVS scan) operation. In that regard, an integrated circuit with a core logic power domain (the CX power domain) and a memory power domain (the MX power domain) will typically include a power management circuit to control whether the bitcell array and the memory periphery are powered on or off during memory sleep modes. The power management circuit responds to sleep control signals for the sleep modes that originate in the core logic power domain. For example, should the core logic determine that the operating conditions are such that the memory may be placed into a sleep mode, the core logic may then assert a sleep mode control signal to the power management circuit.

With respect to the power management circuit responding to an asserted sleep mode control signal, a signal is deemed herein to be "asserted" when the signal is logically true, regardless of whether the logical true state is represented by an active-high or active-low convention. In an active-high convention, a CX power domain control signal is asserted by being charged to the CX power supply voltage. Such a signal is thus de-asserted by being discharged to ground. But in an active-low convention, a CX power domain control signal is asserted by being discharged to ground. An active-low signal is thus de-asserted by being charged to the power supply voltage. The following discussion will assume that the core logic uses an active-low convention for the sleep mode control signals without loss of generality.

In general, there are two types of sleep modes for an integrated circuit memory. In a sleep mode without retention, both the bitcells and the memory periphery are powered down. To activate the sleep mode without retention, the core logic may assert an active-low sleep mode without retention control signal (slp_nret_n) that is also denoted herein as the "slp_nret_n control signal" for brevity. The power management circuit responds to the asserted sleep mode without retention control signal by powering down the bitcell array and the memory periphery. Since the bitcells are powered down, they cannot retain their stored bits; hence the "without retention" designation of the sleep mode without retention. In a sleep mode with retention, the core logic may assert an active-low sleep mode with retention control signal (slp_ret_n) that is denoted herein as the "slp_ret_n control signal" for brevity. The power management circuit responds to the asserted sleep mode with retention control signal by powering down only the memory periphery whereas the bitcell array remains powered. Since the bitcell array remains powered, the bitcells may retain their stored binary content; hence the "with retention" aspect of the sleep mode with retention.

Neither sleep mode control signal is asserted during a traditional DVS scan. For example, should the slp_nret_n control signal be asserted, then both the bitcell array and memory periphery are powered down and cannot be tested by any scanned-in test vectors. Similarly, if the slp_ret_n control signal was asserted, then the memory periphery is powered down and cannot be tested. Since neither the sleep mode with retention nor the sleep mode without retention can be active during a traditional DVS scan, both the bitcell array and the memory periphery are powered and hence a damaging temperature increase as noted earlier may occur. To address the combination of the bitcell leakage and the current drawn by the memory periphery causing memory damage during a DVS scan, an integrated circuit memory is provided in which an improved DVS scan may occur while the sleep mode without retention control signal slp_nret_n is asserted. To do so, the memory's power management circuit is configured to respond to an assertion of a control signal (e.g., an asynchronous control signal) by blocking the asserted slp_nret_n control signal from triggering a shutdown of the memory periphery. Although the powering off of the memory periphery is blocked, the power management circuit still responds to the asserted slp_nret_n control signal by powering off the bitcell array. The bitcell leakage is thus eliminated and cannot combine with the current draw by the memory periphery to cause damaging temperature spikes during the DVS scan. The power supply voltage(s) may thus be sufficiently boosted and for a sufficient duration during the DVS scan to uncover faults in the periphery. Note that a DVS scan is just one example use of the advantageous powering of the memory periphery while the bitcell array is powered off. It will thus be appreciated that the memory control discussed herein is applicable to other types of memory scans in addition to DVS scans.

Figure 1:
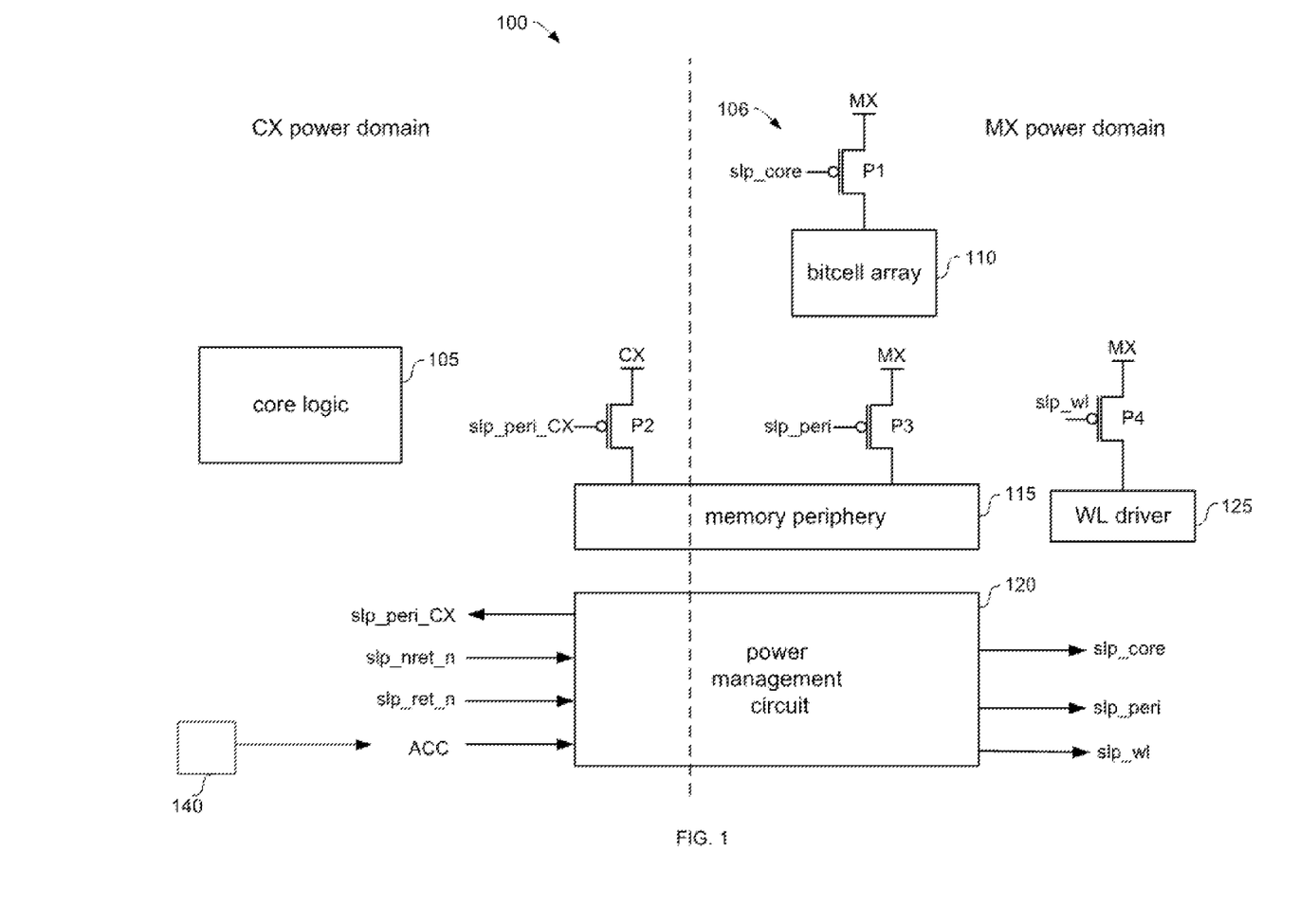
FIG. 1 illustrates an integrated circuit with an embedded memory configured for an improved DVS scan in accordance with an aspect of the disclosure.

Turning now to the drawings, an example system-on-a-chip (SoC) integrated circuit 100 with a core logic circuit 105 and an associated embedded static random-access memory (SRAM) 106 is shown in FIG. 1. Core logic circuit 105 is located within a core (CX) power domain and is thus powered by a CX power supply voltage. SRAM 106 includes a bitcell array 110, a memory periphery 115, and word line (WL) driver 125. Bitcell array 110 and WL driver 125 are located within a memory (MX) power domain and are thus powered by an MX power supply voltage. Memory periphery 115 has an MX power domain portion in the MX power domain and a CX power domain portion in the CX power domain Memory periphery 115 includes the components for reading and writing from bitcell array 110 such as write drivers, address decoders, and so on.

During normal operation of SRAM 106, core logic 105 does not invoke any memory sleep modes. But during dormant periods, core logic 105 may completely power down SRAM 106 by asserting the sleep mode without retention control signal (slp_nret_n). Power management circuit 120 responds to the assertion of the sleep mode without retention control signal by asserting head switch control signals to switch off the head switches powering SRAM 106. Each head switch is represented by a single p-type metal-oxide semiconductor (PMOS) transistor. For example, bitcell array 110 couples to a node for the MX power supply voltage through a PMOS transistor P1. Transistor P1 is an example of a bitcell array head switch. Similarly, WL driver 125 couples to a node for the MX power supply voltage through a PMOS transistor P4. The CX portion of memory periphery 115 couples to a node for the CX power supply voltage through a PMOS transistor P2 whereas the MX portion of memory periphery 115 couples to a node for the MX power supply voltage through a PMOS transistor P3. Transistors P2 and P3 are examples of periphery head switches.

It will be appreciated that each of the head switches may be implemented by multiple PMOS transistors instead of a single PMOS transistor as illustrated. To switch off transistor P1 during a sleep mode without retention in response to the assertion of the slp_nret_n control signal, power management circuit 120 asserts an active-high MX power domain core sleep signal (slp_core) that drives a gate of transistor P1. Transistor P1 will thus switch off to power down bitcell array 110. Similarly, power management circuit 120 asserts an active-high MX power domain periphery sleep signal (slp_peri) that drives a gate of transistor P3 to power down the MX portion of memory periphery 115 in response to the assertion of the slp_nret_n control signal. In the same fashion, power management circuit 120 asserts an active-high CX power domain periphery sleep signal (slp_peri_CX) that drives a gate of transistor P2 to power down the CX portion of the memory periphery 115 in response to the assertion of the slp_nret_n control signal. Finally, power management circuit 120 also asserts an active-high MX power domain word line driver sleep signal (slp_wl) that drives a gate of transistor P4 to power down WL driver 125 in response to the assertion of the slp_nret_n control signal.

Should core logic 105 instead determine that a sleep mode with retention should be invoked, core logic 105 may assert the slp_ret_n control signal. In response to the assertion of the slp_ret_n control signal, power management circuit 120 asserts the slp_wl, slp_peri_CX, and slp_peri signals to cut off the power to memory periphery 115 and WL driver 125. But power management circuit 120 does not assert the slp_core signal in response to the assertion of the slp_ret_n control signal. Thus, bitcell array 110 remains powered so that its bitcells may retain their stored binary content.

To invoke a DVS scan of memory periphery 115, a DVS tester or scan tool (not illustrated) may trigger an assertion of a DVS scan control signal (not illustrated in FIG. 1 but discussed further below) while SRAM 106 is functional (no sleep mode being active). To trigger the assertion of the DVS scan control signal, it is convenient if the DVS tester or scan tool asserts asynchronous control bits in an asynchronous control signal (ACC) received over a plurality of terminals 140 that may be also used for other asynchronous control signals to integrated circuit 100. In this fashion, the input/output interface to integrated circuit 100 need not be modified to accommodate the improved DVS scan disclosed herein. More generally, power management circuit 120 asserts the DVS scan control signal in response to an assertion of CX power domain control signal. It will thus be appreciated that alternative implementations may use other types of control signals beside the ACC control signal. In addition to asserting the ACC signal, the DVS tester may also trigger an assertion of the slp_nret_n control signal. During normal operation, power management circuit 120 would respond to the assertion of the slp_nret_n control signal by powering off not only bitcell array 110 but also memory periphery 115 and WL driver 125. However, power management circuit 120 is configured to respond to the assertion of both the DVS scan control signal and the slp_nret_n control signal by powering off only bitcell array 110. Memory periphery 115 thus remains powered during the DVS scan despite the assertion of the slp_nret_n control signal. In this fashion, only transistor P1 switches off whereas transistors P2, P3, and P4 remain on. As noted earlier, each of transistors P1, P2, P3, and P4 may comprise multiple head switch transistors in alternative implementations. There is thus at least one head switch for each of bitcell array 110, the CX portion of memory periphery 115, the MX portion of memory periphery 115, and WL driver 125. With transistor P1 off and transistors P1, P3, and P4 on, a DVS scan of memory periphery 115 may proceed without requiring a limited increase in the power supply voltage(s).

Without this advantageous DVS scan as managed by power management circuit 120, the CX and MX power supply voltages could not be raised as robustly during a DVS scan of SRAM 106. The actual level of the increased power supply voltage used during a DVS scan of memory periphery 115 will depend upon the process node. In one example implementation, the increased power supply voltage during a traditional DVS scan could only be raised to 1.4 V. But with the power management circuit 120 responding to the DVS scan control signal as discussed herein, the DVS scan may instead be performed with a 1.6 V power supply voltage level and for a longer duration. In this fashion, the DVS scan of SRAM 106 may be sufficiently robust to uncover faults that would otherwise remain undetected.

Figure 2:
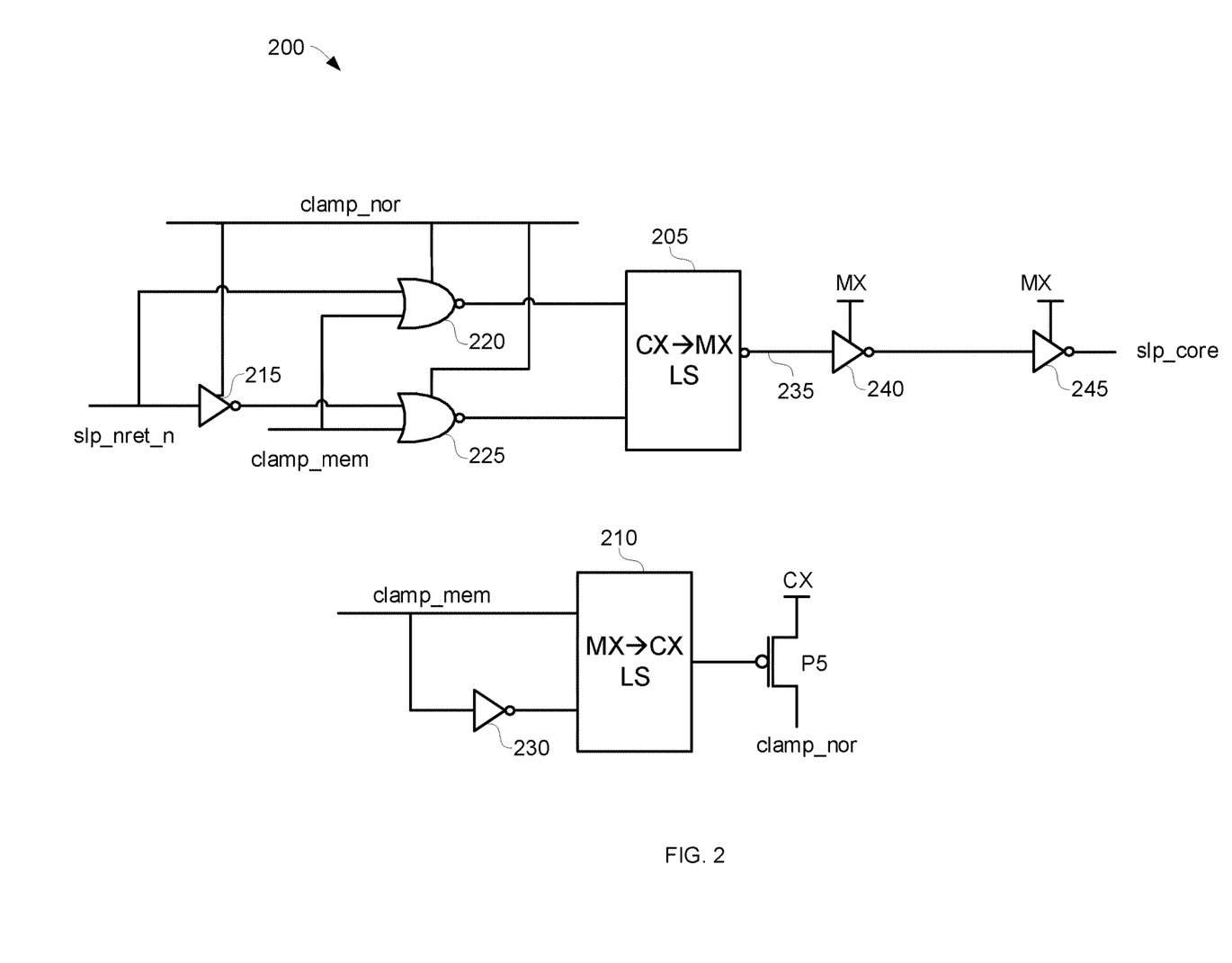
FIG. 2 illustrates a first portion of a power management circuit in the embedded memory of FIG. 1 in accordance with an aspect of the disclosure.

An example implementation of power management circuit 120 will now be described in more detail. FIG. 2 illustrates a first portion 200 of power management circuit 120 that generates the core sleep signal slp_core responsive to the slp_nret_n control signal. Note that the slp_nret_n control signal is a CX power domain signal. In a sleep mode with retention, the CX power domain may be powered down but the MX power domain remains powered. To keep first portion 200 from undesirably responding to CX power domain control signals when the CX power domain is powered down, SRAM 106 receives an active-high MX power domain control signal (clamp_mem) that is asserted when the CX power domain is powered down.

To assist in the retention of a desired binary state for the core sleep signal slp_core despite the CX power domain being powered off, power management circuit 120 includes a latching level-shifter 210 that latches and level-shifts the clamp_mem signal from the MX power domain to the CX power domain. Level-shifter 210 also receives an inverted version of the clamp_mem signal as inverted by an inverter 230. The level-shifted version of the clamp_mem signal drives a gate of a PMOS transistor P5 that has its source connected to a node for the CX power supply voltage. The drain of transistor P5 serves as a node for a clamp_nor signal that will equal the CX power supply voltage when the clamp_mem signal is de-asserted. In this implementation, the clamp_mem signal is an active-high signal and is thus de-asserted by being grounded. The clamp_nor signal will then equal the CX power supply voltage only when the clamp_mem signal is a logic zero.

The clamp_nor signal powers an inverter 215, a NOR gate 220 and a NOR gate 225. The following discussion will assume that the clamp_mem signal is discharged to ground (the CX power domain not being powered down) to cause the clamp_nor signal to be charged to the CX power supply voltage. Inverter 215 functions to invert the sleep mode without retention control signal (slp_nret_n) into an inverted signal processed by NOR gate 225 with the clamp_mem signal. In addition, NOR gate 220 NORs the slp_nret_n control signal with the clamp_mem signal. NOR gates 220 and 225 will each act as an inverter while the clamp_mem signal is de-asserted. If the slp_nret_n control signal is then asserted (recall that the slp_nret_n control signal may be an active-low signal such that is grounded when asserted), the output of NOR gate 220 is asserted to the CX power supply voltage whereas the output of NOR gate 225 is grounded. A latching level-shifter 205 shifts the output of NOR gate 220 from the CX power domain to the MX power domain. An output signal 235 of level-shifter 205 is charged to the MX power supply voltage in response to the assertion the slp_nret_n control signal while the clamp_mem signal is de-asserted. A pair of inverters 240 and 245 buffer the output signal 235 to form the core sleep signal slp_core. The core sleep signal slp_core will thus be asserted to equal the MX power supply voltage in response to the assertion of the slp_nret_n control signal while the clamp_mem signal is de-asserted. The asserted core sleep signal slp_core shuts off the head switch(es) as represented by transistor P1 (FIG. 1) so that bitcell array 110 is powered down in response to the assertion of the slp_nret_n control signal.

The output signal of NOR gate 225 equals the slp_nret_n control signal so long as the clamp_mem signal is de-asserted. Conversely, the output signal of NOR gate 220 equals the complement of the slp_nret_n control signal so long as the clamp_mem signal is de-asserted. Since level-shifter 205 is level-shifting this complement of the slp_nret_n control signal, the output of level-shifter 205 is indicated with an "inversion bubble" to indicate that it is level-shifting the complement of the slp_nret_n control signal instead of level-shifting the slp_nret_n control signal itself.

If the slp_nret_n control signal is de-asserted (charged to the CX power supply due to its active-low implementation), the output of NOR gate 220 will be discharged whereas the output of NOR gate 225 will be charged to the CX power supply voltage. The output signal 235 of level-shifter 205 will thus be discharged to ground, which grounds the core sleep signal slp_core. Bitcell array 110 is thus powered while the slp_nret_n control signal is de-asserted.

Figure 3:
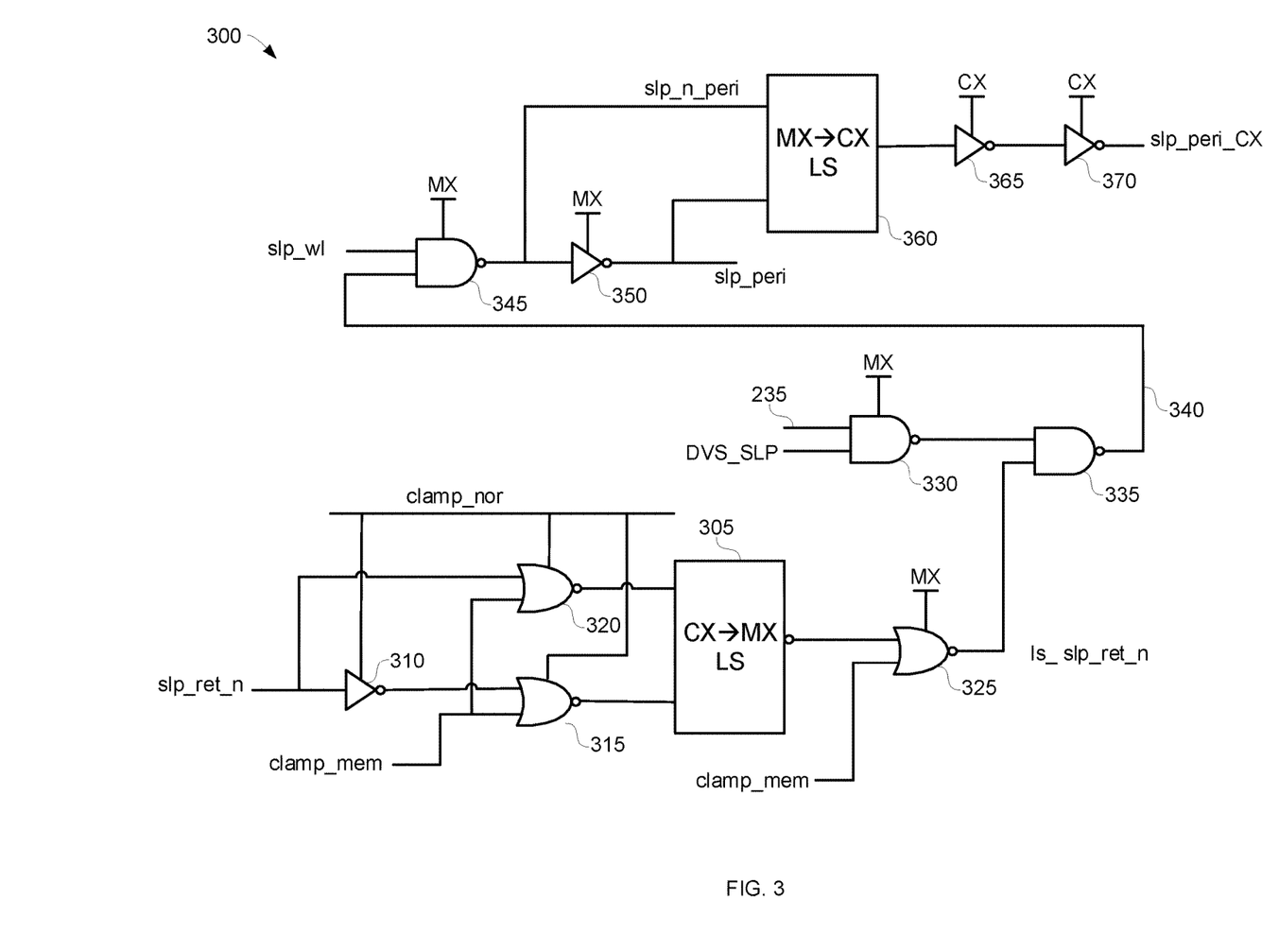
FIG. 3 illustrates a second portion of the power management circuit in the embedded memory of FIG. 1 in accordance with an aspect of the disclosure.

A portion 300 of power management circuit 120 is shown in FIG. 3 for the generation of the slp_peri and the slp_peri_CX signals responsive to the slp_nret_n control signal and also to the slp_ret_n control signal. Recall that output signal 235 was generated as discussed regarding portion 200 of power management circuit 120 responsive to the slp_nret_n control signal. A logic gate such as a NAND gate 330 processes output signal 235 with a DVS scan control signal that is also denoted herein as the DVS_SLP signal for brevity. As will be explained further herein, power management circuit 120 asserts the DVS_SLP signal during a DVS scan so that the asserted slp_nret_n control signal does not cause a cutoff of power to memory periphery 115. It will be assumed herein without loss of generality that the DVS_SLP signal is an active-low signal so that it is de-asserted during normal operation by being charged to the MX power supply voltage. During normal (non-DVS scan) operation, NAND gate 330 thus functions as an inverter to drive a NAND gate 335 with an inverted version of output signal 235. As will be explained further herein, NAND gate 335 NANDs the inverted version of output signal 235 with a level-shifted version (ls_slp_ret_n) of the sleep mode with retention control signal (slp_ret_n). During a sleep mode without retention, the ls_slp_ret_n signal is charged to the MX power supply voltage so that NAND gate 335 acts as an inverter. Thus, an output signal 340 of NAND gate 335 will equal output signal 235 during the sleep mode without retention (the DVS_SLP signal not being asserted). NAND gate 330 is an example of a second logic gate configured to process the DVS scan control signal to prevent the assertion of a periphery sleep signal. NAND gate 335 is an example of a third logic gate configured to process an output signal of the second logic gate with a memory power domain sleep mode with retention control signal (e.g., ls_slp_ret_n).

A NAND gate 345 NANDs output signal 340 with the slp_wl signal. As will be explained further herein, the slp_wl signal is asserted to the MX power supply voltage during a sleep mode, regardless of whether it is with retention or without. NAND gate 345 will thus function as an inverter during a sleep mode without retention to invert output signal 340 into a complement (slp_n_peri) of the slp_peri signal. An inverter 350 inverts the complement signal slp_n_peri to form the slp_peri signal. During the sleep mode without retention, the slp_peri signal will thus be asserted to the MX power supply voltage to cutoff power to the MX power domain portion of memory periphery 115.

A latching level-shifter 360 level-shifts the slp_peri signal from the MX power domain to the CX power domain. A pair of serially-arranged inverters 365 and 370 buffer an output signal of level-shifter 360 to form the slp_peri_CX signal. During the sleep mode without retention, the slp_peri_CX signal will thus be asserted to the CX power supply voltage to cutoff power to the CX power domain portion of memory periphery 115. Memory periphery 115 is thus powered down during the sleep mode without retention.

An inverter 310, a NOR gate 320, and as NOR gate 315 are powered by the clamp_nor signal. In a sleep mode with retention, the sleep mode with retention control signal (slp_ret_n) is asserted by being discharged to ground. Inverter 310 inverts the slp_ret_n control signal to drive NOR gate 315, which also receives the clamp_mem signal. With the CX power domain being powered, NOR gate 315 thus acts as an inverter to invert the inverted output signal from inverter 310 to reproduce the slp_ret_n control signal. Another NOR gate 320 NORs the slp_ret_n control signal with the clamp_mem signal. With the CX power domain remaining powered, NOR gate 320 thus acts as an inverter to invert the slp_ret_n control signal to provide an inverted version of the slp_ret_n control signal. A latching level-shifter 305 levels shifts the inverted version of the slp_ret_n control signal from the CX power domain to the MX power domain (an output node of level-shifter 305 is thus indicated with an inversion bubble). An output signal of level-shifter 305 will then be asserted to the MX power supply voltage during the sleep mode with retention. A NOR gate 325 NORs the output signal of level-shifter 305 with the clamp_mem signal. NOR gate 325 thus acts as inverter while the CX power domain remains powered to invert the output signal of level-shifter 305 into the level-shifted version ls_slp_ret_n of the slp_ret_n control signal.

During normal operation (the DVS scan being inactive), the DVS_SLP signal is charged to the MX power supply so that NAND gate 330 inverts output signal 235. Since output signal 235 is a level-shifted and inverted version of the slp_nret_n control signal, output signal 235 is thus discharged to ground during the sleep mode with retention. The output signal of NAND gate 330 will then be charged to the MX power supply voltage during the sleep mode with retention. This charging of the output signal of NAND gate 330 forces NAND gate 335 to function as an inverter. Output signal 340 of NAND gate 335 will thus be charged to the MX power supply voltage during the sleep mode with retention. As will be explained further herein, the slp_wl control signal is asserted during the sleep mode with retention so that NAND gate 345 inverts output signal 340 to cause the output signal of NAND gate 345 to be discharged to ground. The slp_peri and the slp_peri_CX signals will thus both be charged to cut off power to the memory periphery 115 during the sleep mode with retention analogously as discussed for the sleep mode without retention. However, bitcell array 110 remains powered because the slp_nret_n control signal is de-asserted (charged to the CX power supply voltage) while the sleep mode with retention is active.

The transition to the DVS scan occurs from a functional (non-sleep) mode of operation for SRAM 106 as will be explained further herein. During such a functional mode, bitcell array 110 and memory periphery 115 are powered and thus the slp_nret_n control signal and the slp_ret_n control signal are charged to the CX power supply voltage. But the slp_nret_n control signal is then discharged during the transition to the DVS scan. Since the slp_nret_n control signal is discharged, output signal 235 is charged to the MX power supply. The DVS_SLP signal is asserted by being discharged to ground in the transition from the functional mode to the DVS scan. This assertion of the DVS_SLP signal by being discharged to ground while output signal 235 is asserted forces the output signal of NAND gate 330 to be charged to the MX power supply voltage. The level-shifted version ls_slp_ret_n of the slp_ret_n control signal is also charged to the MX power supply during the DVS scan. Output signal 340 of NAND gate 335 will thus be discharged to ground during the DVS scan, which forces the output of NAND gate 345 to be asserted to the MX power supply voltage. The slp_peri and the slp_peri_CX signals will thus be de-asserted by being grounded during the DVS scan so as to keep memory periphery 115 powered despite the assertion of slp_nret_n control signal. This is quite advantageous with regard to limiting complexity as the DVS scan may function without requiring a rework or modification of the control of the sleep modes by the slp_nret_n and slp_ret_n control signals.

Figure 4:
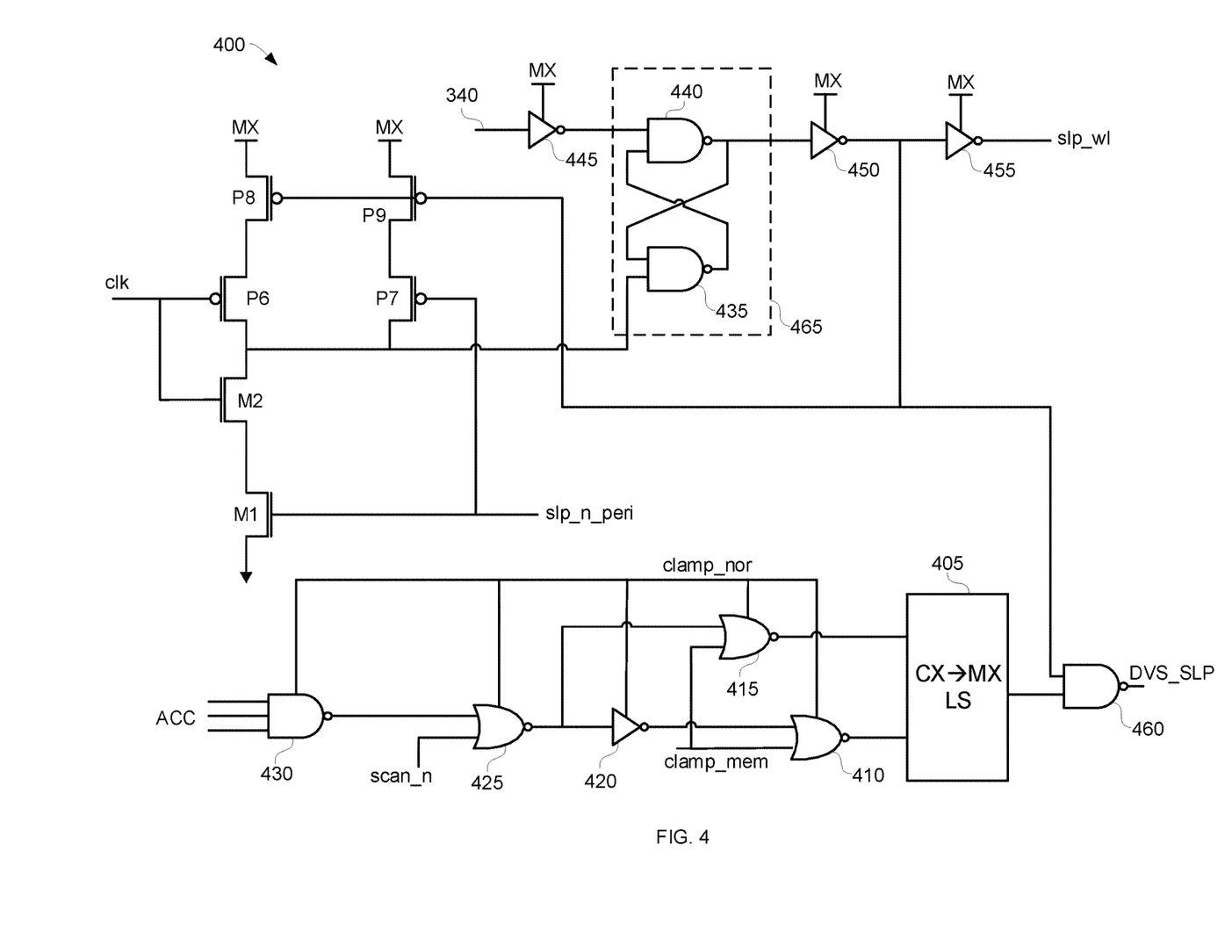
FIG. 4 illustrates a third portion of the power management circuit in the embedded memory of FIG. 1 in accordance with an aspect of the disclosure.

A portion 400 of power management circuit 120 is shown in FIG. 4 for the generation of the DVS scan control signal (DVS_SLP) and the slp_wl signal. With regard to the generation of the DVS_SLP signal, an integrated circuit such as integrated circuit 100 will typically include a number of asynchronous control pins or terminals such as terminals 140 (shown in FIG. 1) so that integrated circuit 100 may be configured as desired by a user. It is thus convenient for the DVS_SLP signal to be asserted responsive to an asynchronous control (ACC) signal as controlled by an external DVS tester (not illustrated) through terminals 140. In portion 400, three one-bit asynchronous control signals are used by the external DVS tester to generate the ACC signal. The ACC signal is thus three bits wide, but it will be appreciated that other bit widths may be used in alternative implementations. A NAND gate 430 NANDs the ACC control signal bits. An output signal of NAND gate 430 will thus be discharged responsive to an assertion of the ACC control signal bits to the CX power supply voltage. A NOR gate 425 NORs an active-low scan control signal scan_n with the output signal of NAND gate 430. In this fashion, the assertion of the ACC signal during a non-DVS scan mode of operation is prevented from activating a DVS scan. An output signal of NOR gate 425 will be asserted to the CX power supply voltage in response to the assertion of the ACC control signal by the external DVS tester since the scan_n signal will be discharged. An inverter 420 inverts the output signal of NOR gate 425. An output signal of inverter 420 will thus be discharged to ground in response to the assertion of the ACC and scan_n signals. A NOR gate 410 NORs the output signal of inverter 420 with the clamp_mem signal (the following discussion assumes that the clamp_mem signal is discharged due to the CX power domain being initially powered). An output signal of NOR gate 410 will thus be asserted to the CX power supply in response to the assertion of the ACC control signal to trigger a DVS scan. A NOR gate 415 NORs the clamp_mem signal with the output signal of NOR gate 425. An output signal of NOR gate 415 will thus be discharged to ground in response to the assertion of the ACC control signal during a DVS scan. NAND gate 430, NOR gate 425, inverter 420, NOR gate 415, and NOR gate 410 are all powered by the clamp_nor signal and are thus powered so long as the clamp_mem signal is de-asserted.

A latching level-shifter 405 level-shifts the output signal of NOR gate 410 from the CX power domain to the MX power domain. An output signal of level-shifter 405 will thus be asserted to the MX power supply voltage in response to the assertion of ACC control signal and the scan_n signal. A NAND gate 460 NANDs the output signal of level-shifter 405 with an output signal of an inverter 450 to form the DVS scan control signal DVS_SLP. An inverter 455 inverts the output signal of inverter 450 to form the slp_wl signal. The output signal of inverter 450 is thus asserted to the MX power supply voltage while SRAM 106 is functional, which causes NAND gate 460 to function as an inverter. NAND gate 460 will thus discharge the DVS_SLP signal to ground in response to the assertion of ACC control signal while the scan_n signal is asserted. Level-shifter 405 may also be denoted herein as a first level-shifter. The output signal of level-shifter 405 may also be denoted herein as a memory power domain control signal. NAND gate 460 is an example of a first logic gate configured to process the memory power domain control signal to assert the DVS_SLP signal. Level-shifter 305 may also be denoted herein as a second level-shifter.

In a power up from a power down state, SRAM 106 may be programmed to power up in the sleep mode without retention. The slp_nret_n control signal is then charged during the power up of SRAM 106 to cause SRAM 106 to transition to the functional mode of operation. However, note that the ACC signal and the scan_n signal are CX power domain signals. Because the CX power domain is initially unstable during the memory power up it is thus possible that the ACC control signal is asserted while the slp_nret_n control signal and the scan_n signal are still discharged. The unintentional assertion of the ACC control signal could then cause an unintentional assertion of the DVS_SLP signal. The unintentional assertion of the DVS_SLP signal could then trigger a power-on of memory periphery 115 prior to the charging of the slp_nret_n control signal. Memory periphery 115 may then have increased leakage during the delay from the unintentional assertion of the DVS_SLP signal to the intentional charging of the slp_nret_n control signal. To prevent memory periphery 115 from powering on until the slp_nret_n control signal is charged during the power up of SRAM 106, the assertion of the DVS_SLP signal is gated by a clock signal (clk). The DVS_SLP signal may thus only be asserted following a triggering clock edge (e.g., a rising edge) of the clock signal.

To perform this clock gating, portion 400 includes a set-reset latch 465 such as formed by a cross-coupled pair of NAND gates 440 and 435. A drain of a PMOS transistor P6 that is connected to a drain of an NMOS transistor M2 that is also connected to the drain of a PMOS transistor P7 functions as an input node to NAND gate 435. An inverter 445 inverts output signal 340 from portion 300 of power management circuit 120 to drive NAND gate 440 in latch 465. The source of transistor M2 couples through an NMOS transistor M1 to ground. The complement signal slp_n_peri drives the gates of transistors M1 and P7. During the functional mode for SRAM 106, the slp_wl signal is discharged to ground and the complement signal slp_n_peri is charged to the MX power supply voltage. At the transition from the functional mode to a DVS scan, transistor M1 will thus be on whereas transistor P7 will be off.

During the power-up of SRAM 106, the slp_wl signal may initially be charged to the MX power supply voltage. The output signal from inverter 450 is thus discharged to ground. The output signal of inverter 450 drives a gate of a PMOS transistor P8 and a gate of a PMOS transistor P9. The sources of transistors P8 and P9 couple to a node for the MX power supply voltage. A drain of transistor P8 couples to a source of transistor P6. Similarly, a drain of transistor P9 couples to a source of transistor P7. With the slp_wl control signal being charged, transistors P8 and P9 are thus conducting. Since the clock signal drives the gates of seriallycoupled transistors P6 and M2, transistors P6 and M2 function as an inverter while transistors P8 and M1 are conducting. Prior to the cycling of the clock signal, the clock signal will be discharged such that transistor P6 is on to charge the input signal to NAND gate 435 to the MX power supply voltage. Since the output signal of inverter 450 is discharged, the output signal of NAND gate 440 is charged to the MX power supply voltage. An output signal of NAND gate 435 is thus discharged while the clock signal is low during the power up of SRAM 106. This discharged output signal of NAND gate 435 forces the output signal of NAND gate 440 to be charged to the MX power supply regardless of whether the DVS_SLP signal is asserted by being discharged. The slp_wl signal will thus remain charged prior to the cycling of the clock signal.

At the rising edge of the clock signal (the clock signal transitioning from ground to the MX power supply voltage), the drain of transistor P6 is discharged to ground. This causes the output signal of NAND gate 435 to be charged to the MX power supply voltage. In turn, the charging of the output signal of NAND gate 435 causes NAND gate 440 to function as an inverter. As discussed previously, the charging of the slp_nret_n control signal while the DVS scan control signal DVS_SLP is charged, causes output signal 340 to be discharged and in turn causes the output signal of inverter 445 to be charged to the MX power supply voltage. The output signal of NAND gate 440 will thus be discharged at the rising edge of the clock signal when the slp_nret_n control signal is charged, which causes the output signal of inverter 450 to be charged to the MX power supply voltage and causes the slp_wl signal to be discharged. The charging of the output signal of inverter 450 to the MX power supply voltage then causes NAND gate 460 to function as an inverter so that the DVS_SLP signal may be discharged. Since the DVS_SLP signal cannot be discharged until the rising edge of the clock (and also the charging of the slp_nret_n control signal), the potential leakage of memory periphery 115 from an unintentional assertion of the ACC control signal prior to the subsequent intentional charging of the slp_nret_n control signal is solved by the clock gating of the DVS_SLP signal.

Figure 5:
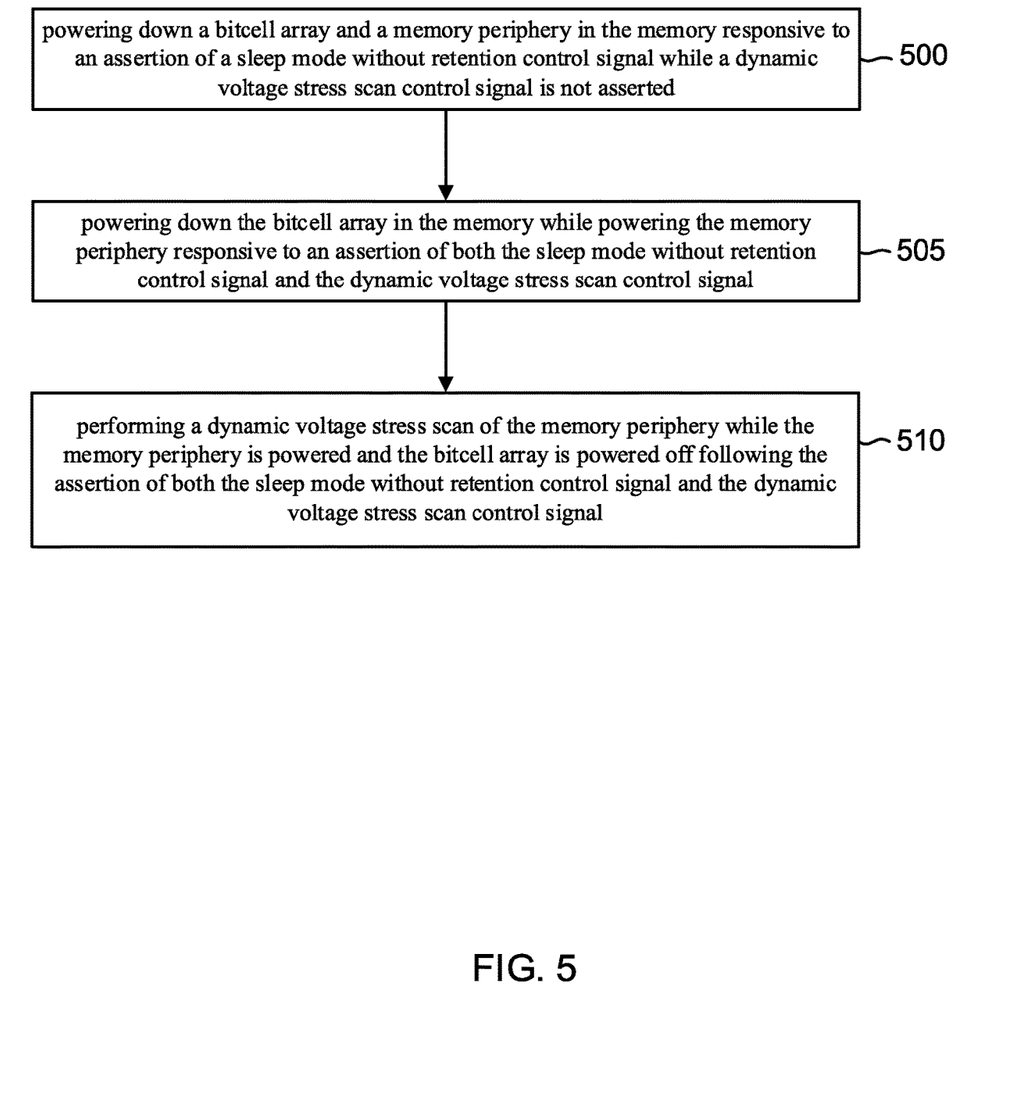
FIG. 5 is a flowchart for a method of operation of a memory configured for an improved DVS scan in accordance with an aspect of the disclosure.

A method of operation for a memory configured for an improved DVS scan will now be discussed with regard to the flowchart of FIG. 5. The method includes an act 500 of powering down a bitcell array and a memory periphery in the memory responsive to an assertion of a sleep mode without retention control signal while a dynamic voltage stress scan control signal is not asserted. The assertion of the slp_core, slp_peri_CX, and the slp_peri control signals to power down bitcell array 110 and memory periphery 115 during the sleep mode without retention is an example of act 500. The DVS_SLP signal is an example of the dynamic voltage stress scan signal.

The method also includes an act 505 of powering down the bitcell array in the memory while powering the memory periphery responsive to an assertion of both the sleep mode without retention control signal and the dynamic voltage stress scan control signal. The assertion of only the slp_core control signal to power down bitcell array 110 while memory periphery 115 is powered during a DVS scan is an example of act 505.

Finally, the method includes an act 510 of performing a dynamic voltage stress scan of the memory periphery while the memory periphery is powered and the bitcell array is powered off following the assertion of both the sleep mode without retention control signal and the dynamic voltage stress scan control signal. The DVS scanning of memory periphery 115 by an external DVS tester is an example of act 510.

Figure 6:
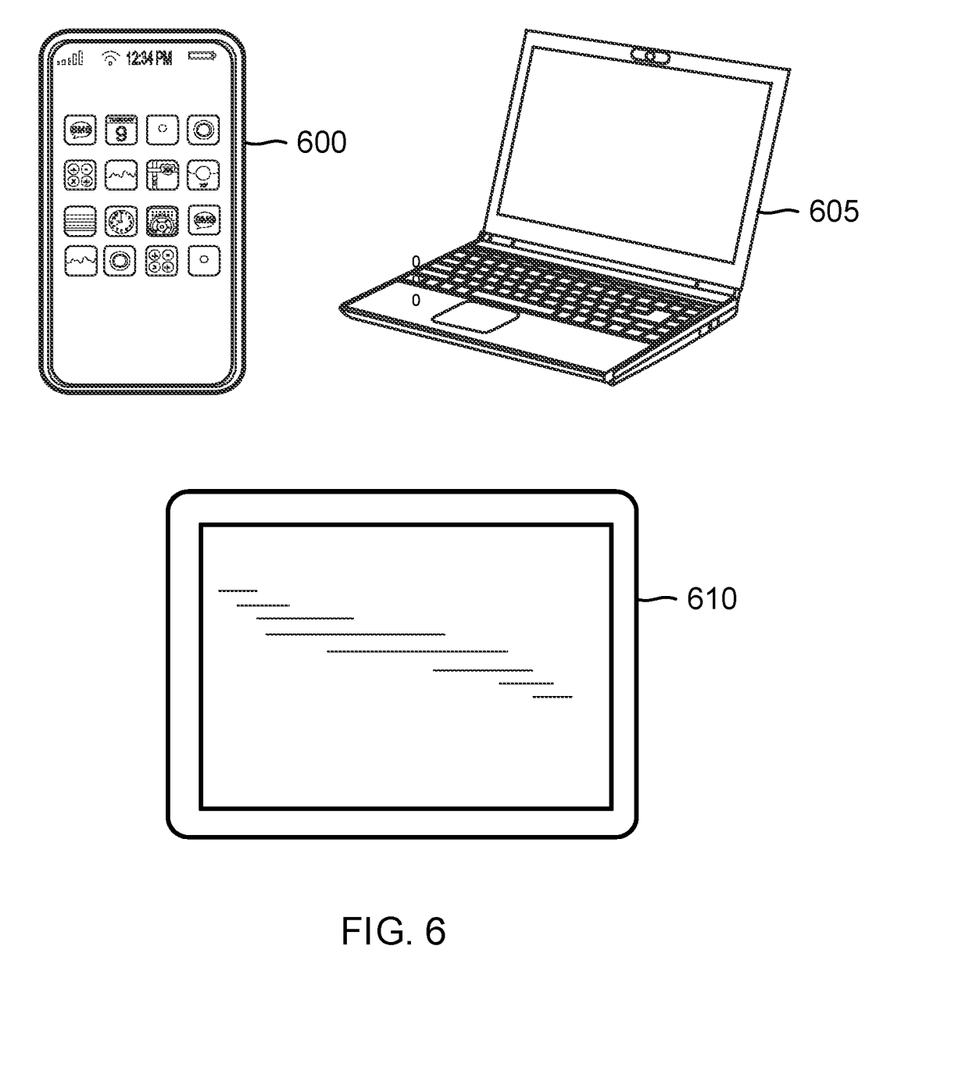
FIG. 6 illustrates some example electronic systems each incorporating a memory with configured for an improved DVS in accordance with an aspect of the disclosure.

A memory configured for an improved DVS scan as disclosed herein may be incorporated into a wide variety of electronic systems. For example, as shown in FIG. 6, a cellular telephone 600, a laptop computer 605, and a tablet PC 610 may all include a memory configured for an improved DVS scan in accordance with the disclosure. Other exemplary electronic systems such as a music player, a video player, a communication device, and a personal computer may also be configured with memories constructed in accordance with the disclosure.

Some aspects of the disclosure will now be summarized in the following series of example clauses:

Clause 1. A memory, comprising:
  a bitcell array;
  a bitcell array head switch coupled between the bitcell array and a node for a memory power supply voltage;
  a memory periphery including a memory power domain portion;
  a memory periphery head switch coupled between the memory power domain portion and the node for the memory power supply voltage; and
  a power management circuit configured to switch off the bitcell array head switch and the memory periphery head switch to power off the bitcell array and the memory power domain portion during a sleep mode without retention for the memory, the power management circuit being further configured to switch off only the bitcell array head switch to power off the bitcell array and to maintain a power on of the memory power domain portion during a scan of the memory.

Clause 2. The memory of clause 1, wherein the bitcell array head switch is configured to switch off responsive to an assertion of a sleep core signal and the memory periphery head switch is configured to switch off responsive to an assertion of a periphery sleep signal, and wherein the power management circuit is further configured to assert both the sleep core signal and the periphery sleep signal responsive to an assertion of a sleep mode without retention control signal during the sleep mode without retention for the memory,
  the power management circuit being further configured to assert the sleep core signal and to not assert the periphery sleep signal responsive to an assertion of the sleep mode without retention control signal during the scan of the memory.

Clause 3. The memory of clause 2, wherein the power management circuit further includes:
  a first level-shifter configured to level-shift a core power domain control signal into a memory power domain control signal; and
  a first logic gate configured to process the memory power domain control signal to assert a DVS scan control signal, wherein the power management circuit is further configured to respond to an assertion of the DVS scan control signal to prevent an assertion of the periphery sleep signal.

Clause 4. The memory of clause 3, wherein the power management circuit further includes:
  a second logic gate configured to process the DVS scan control signal to prevent the assertion of the periphery sleep signal.

Clause 5. The memory of clause 2, wherein the memory periphery further includes a core power domain portion, the memory further comprising:

a core power domain head switch coupled between the core power domain portion and the node for the memory power supply voltage, the core power domain head switch being configured to switch off to power down the core power domain portion responsive to an assertion of a core power domain periphery sleep signal, wherein the power management circuit is further configured to assert the core power domain periphery sleep signal responsive to the assertion of the sleep mode without retention control signal while the DVS scan control signal is not asserted, the power management circuit being further configured to not assert the core power domain periphery sleep signal responsive to the assertion of the sleep mode without retention control signal while the DVS scan control signal is asserted.

Clause 6. The memory of any of clauses 3-4, wherein the power management circuit further includes:
  a second level-shifter configured to level-shift the sleep mode without retention control signal into a memory power domain signal, and wherein the second logic gate is configured to process the DVS scan control signal with the memory power domain signal to prevent the assertion of the periphery sleep signal.

Clause 7. The memory of any of clauses 4-5, wherein the power management circuit is further configured to assert both assert the periphery sleep signal and to not assert the sleep core signal responsive to an assertion of a sleep mode with retention control signal.

Clause 8. The memory of clause 7, wherein the power management circuit further includes:
  a second level-shifter configured to level-shift the sleep mode with retention control signal into a memory power domain sleep mode with retention control signal; and
  a third logic gate configured to process an output of the second logic gate with the memory power domain sleep mode with retention control signal.

Clause 9. The memory of any of clauses 4-8, wherein the power management circuit further includes:
  a latch configured to prevent the assertion of the DVS scan control signal while a clock signal has not cycled, the latch being further configured to permit the assertion of the DVS scan control signal responsive to a rising edge of the clock signal.

Clause 10. The memory of clause 9, wherein the latch comprises a pair of cross-coupled NAND gates.

Clause 11. The memory of clause 10, wherein the power management circuit further includes an inverter configured to invert the clock signal to drive an input to a first NAND gate in the pair of cross-coupled NAND gates.

Clause 12. The memory of any of clauses 1-11, wherein the bitcell array head switch and the memory power domain head switch each comprises at least one p-type metal-oxide semiconductor (PMOS) transistor.

Clause 13. A method of operation for a memory, comprising:
  powering down a bitcell array and a memory periphery in the memory responsive to an assertion of a sleep mode without retention control signal while a dynamic voltage stress scan control signal is not asserted;
  powering down the bitcell array in the memory while powering the memory periphery responsive to an assertion of both the sleep mode without retention control signal and the dynamic voltage stress scan control signal; and
  performing a dynamic voltage stress scan of the memory periphery while the memory periphery is powered and the bitcell array is powered off following the assertion of both the sleep mode without retention control signal and the dynamic voltage stress scan control signal.

Clause 14. The method of clause 13, further comprising:
  level-shifting a core power domain control signal into a memory power domain control signal; and
  asserting the dynamic voltage stress scan control signal responsive to an assertion of the memory power domain control signal.

Clause 15. The method of clause 14, further comprising:
  gating the assertion of the dynamic voltage stress scan control signal to occur only after an assertion of a clock signal.

Clause 16. The method of any of clauses 13-15, wherein powering down the memory periphery comprising powering down a memory power domain portion and a core power domain portion.

Clause 17. The method of any of clauses 13-16, further comprising:
  powering down a word line driver responsive to the assertion of the sleep mode without retention control signal while the dynamic voltage stress scan control signal is not asserted.

Clause 18. The method of clause 17, further comprising:
  maintaining a powering of the word line driver responsive to the assertion of both the sleep mode without retention control signal and the dynamic voltage stress scan control signal.

Clause 19. A memory, comprising:
  a memory periphery including a memory power domain portion;
  a periphery head switch coupled between a node for a memory power supply voltage and the memory power domain portion; and
  a power management circuit including a first logic gate configured to assert a dynamic voltage stress scan control signal responsive to an assertion of a core power domain control signal, wherein the power management circuit is configured to switch off the periphery head switch responsive to an assertion of a sleep mode without retention control signal while the dynamic voltage stress scan control signal is de-asserted, and wherein the power management circuit is further configured to keep the periphery head switch on responsive to an assertion of both the sleep mode without retention control signal and the dynamic voltage stress scan control signal.

Clause 20. The memory of clause 19, wherein the memory is included in an integrated circuit including a plurality of terminals configured to receive the core power domain control signal, the power management circuit further including:
  a first level-shifter configured to level-shift the core power domain control signal into a memory power domain control signal, wherein the first logic gate is further configured to assert the dynamic voltage stress scan control signal responsive to an assertion of the memory power domain control signal.

Clause 21. The memory of clause 19, wherein the power management circuit further includes a second logic gate configured to process the dynamic voltage stress scan control signal to prevent a switching off of the periphery head switch responsive to the assertion of the dynamic voltage stress scan control signal.

Clause 22. The memory of clause 19, wherein the power management circuit is further configured to switch off the periphery head switch responsive to an assertion of a sleep mode with retention control signal.

Clause 23. The memory of any of clauses 19-22, wherein the memory is included in a cellular telephone.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A memory, comprising:
   a bitcell array;
   a bitcell array head switch coupled between the bitcell array and a node for a memory power supply voltage;
   a memory periphery including a memory power domain portion;
   a memory periphery head switch coupled between the memory power domain portion and the node for the memory power supply voltage; and
   a power management circuit configured to switch off the bitcell array head switch and the memory periphery head switch to power off the bitcell array and the memory power domain portion during a sleep mode without retention for the memory, the power management circuit being further configured to switch off only the bitcell array head switch to power off the bitcell array and to maintain a power on of the memory power domain portion during a scan of the memory.

2. The memory of claim 1, wherein the bitcell array head switch is configured to switch off responsive to an assertion of a sleep core signal and the memory periphery head switch is configured to switch off responsive to an assertion of a periphery sleep signal, and wherein the power management circuit is further configured to assert both the sleep core signal and the periphery sleep signal responsive to an assertion of a sleep mode without retention control signal during the sleep mode without retention for the memory,
   the power management circuit being further configured to assert the sleep core signal and to not assert the periphery sleep signal responsive to an assertion of the sleep mode without retention control signal during the scan of the memory.

3. The memory of claim 2, wherein power management circuit further includes:
   a first level-shifter configured to level-shift a core power domain control signal into a memory power domain control signal; and
   a first logic gate configured to process the memory power domain control signal to assert a dynamic voltage stress (DVS) scan control signal, wherein the power management circuit is further configured to respond to an assertion of the DVS scan control signal to prevent an assertion of the periphery sleep signal.

4. The memory of claim 3, wherein the power management circuit further includes:
   a second logic gate configured to process the DVS scan control signal to prevent the assertion of the periphery sleep signal.

5. The memory of claim 4, wherein the power management circuit further includes:
   a second level-shifter configured to level-shift the sleep mode without retention control signal into a memory power domain signal, and wherein the second logic gate is configured to process the DVS scan control signal with the memory power domain signal to prevent the assertion of the periphery sleep signal.

6. The memory of claim 4, wherein the power management circuit is further configured to assert both assert the periphery sleep signal and to not assert the sleep core signal responsive to an assertion of a sleep mode with retention control signal.

7. The memory of claim 6, wherein the power management circuit further includes:
   a second level-shifter configured to level-shift the sleep mode with retention control signal into a memory power domain sleep mode with retention control signal; and
   a third logic gate configured to process an output signal of the second logic gate with the memory power domain sleep mode with retention control signal.

8. The memory of claim 4, wherein the power management circuit further includes:
   a latch configured to prevent the assertion of the DVS scan control signal while a clock signal has not cycled, the latch being further configured to permit the assertion of the DVS scan control signal responsive to a rising edge of the clock signal.

9. The memory of claim 8, wherein the latch comprises a pair of cross-coupled NAND gates.

10. The memory of claim 9, wherein the power management circuit further includes an inverter configured to invert the clock signal to drive an input to a first NAND gate in the pair of cross-coupled NAND gates.

11. The memory of claim 3, wherein the memory periphery further includes a core power domain portion, the memory further comprising:
    a one core power domain head switch coupled between the core power domain portion and the node for the memory power supply voltage, the core power domain head switch being configured to switch off to power down the core power domain portion responsive to an assertion of a core power domain periphery sleep signal, wherein the power management circuit is further configured to assert the core power domain periphery sleep signal responsive to the assertion of the sleep mode without retention control signal while the DVS scan control signal is not asserted, the power management circuit being further configured to not assert the core power domain periphery sleep signal responsive to the assertion of the sleep mode without retention control signal while the DVS scan control signal is asserted.

12. The memory of claim 1, wherein the bitcell array head switch and the memory periphery head switch each comprises at least one p-type metal-oxide semiconductor (PMOS) transistor.

13. A method of operation for a memory, comprising:
    powering down a bitcell array and a memory periphery in the memory responsive to an assertion of a sleep mode without retention control signal while a dynamic voltage stress scan control signal is not asserted;
    powering down the bitcell array in the memory while powering the memory periphery responsive to an assertion of both the sleep mode without retention control signal and the dynamic voltage stress scan control signal; and performing a dynamic voltage stress scan of the memory periphery while the memory periphery is powered and the bitcell array is powered off following the assertion of both the sleep mode without retention control signal and the dynamic voltage stress scan control signal.

14. The method of claim 13, further comprising:
level-shifting a core power domain control signal into a memory power domain control signal; and
asserting the dynamic voltage stress scan control signal responsive to an assertion of the memory power domain control signal.

15. The method of claim 14, further comprising:
gating the assertion of the dynamic voltage stress scan control signal to occur only after an assertion of a clock signal.

16. The method of claim 13, wherein powering down the memory periphery comprising powering down a memory power domain portion and a core power domain portion.

17. The method of claim 13, further comprising:
powering down a word line driver responsive to the assertion of the sleep mode without retention control signal while the dynamic voltage stress scan control signal is not asserted.

18. The method of claim 17, further comprising:
maintaining a powering of the word line driver responsive to the assertion of both the sleep mode without retention control signal and the dynamic voltage stress scan control signal.

19. A memory, comprising:
a memory periphery including a memory power domain portion;
a periphery head switch coupled between a node for a memory power supply voltage and the memory power domain portion; and
a power management circuit including a first logic gate configured to assert a dynamic voltage stress scan control signal responsive to an assertion of a core power domain control signal, wherein the power management circuit is configured to switch off the periphery head switch responsive to an assertion of a sleep mode without retention control signal while the dynamic voltage stress scan control signal is de-asserted, and wherein the power management circuit is further configured to keep the periphery head switch on responsive to an assertion of both the sleep mode without retention control signal and the dynamic voltage stress scan control signal.

20. The memory of claim 19, wherein the memory is included in an integrated circuit including a plurality of terminals configured to receive the core power domain control signal, the power management circuit further including:
a first level-shifter configured to level-shift the core power domain control signal into a memory power domain control signal, wherein the first logic gate is further configured to assert the dynamic voltage stress scan control signal responsive to an assertion of the memory power domain control signal.

21. The memory of claim 19, wherein the power management circuit further includes a second logic gate configured to process the dynamic voltage stress scan control signal to prevent a switching off of the periphery head switch responsive to the assertion of the dynamic voltage stress scan control signal.

22. The memory of claim 19, wherein the power management circuit is further configured to switch off the periphery head switch responsive to an assertion of a sleep mode with retention control signal.

23. The memory of claim 19, wherein the memory is included in a cellular telephone.

* * * * *